(12) United States Patent
Hosseini et al.

(10) Patent No.: US 8,872,315 B2
(45) Date of Patent: Oct. 28, 2014

(54) ELECTRONIC DEVICE AND METHOD OF FABRICATING AN ELECTRONIC DEVICE

(75) Inventors: Khalil Hosseini, Weihmichl (DE);
Joachim Mahler, Regensburg (DE);
Ivan Nikitin, Regensburg (DE);
Gottfried Beer, Nittendorf (DE)

(73) Assignee: Infineon Technologies AG, Neubiberg (DE)

( * ) Notice: Subject to any disclaimer, the term of this patent is extended or adjusted under 35 U.S.C. 154(b) by 12 days.

(21) Appl. No.: 13/570,783

(22) Filed: Aug. 9, 2012

(65) Prior Publication Data

US 2014/0042603 A1    Feb. 13, 2014

(51) Int. Cl.
*H01L 23/48*    (2006.01)

(52) U.S. Cl.
USPC ............................................. 257/676

(58) Field of Classification Search
CPC ............ H01L 2224/48247; H01L 2924/01079
USPC ............................................. 257/676
See application file for complete search history.

(56) References Cited

U.S. PATENT DOCUMENTS

| | | | |
|---|---|---|---|
| 5,300,158 A * | 4/1994 | Chen et al. | 148/258 |
| 7,214,962 B2 * | 5/2007 | Akram et al. | 257/48 |
| 2007/0001313 A1 * | 1/2007 | Fujimoto et al. | 257/778 |
| 2007/0277909 A1 * | 12/2007 | Tsukahara et al. | 148/24 |
| 2010/0230766 A1 * | 9/2010 | Elian et al. | 257/414 |
| 2012/0211764 A1 * | 8/2012 | Okamoto et al. | 257/76 |

* cited by examiner

*Primary Examiner* — Tran Tran
(74) *Attorney, Agent, or Firm* — Slater & Matsil, L.L.P.

(57) ABSTRACT

A semiconductor device includes an electrically conducting carrier and a semiconductor chip disposed over the carrier. The semiconductor device also includes a porous diffusion solder layer provided between the carrier and the semiconductor chip.

15 Claims, 6 Drawing Sheets

ELECTRONIC DEVICE AND METHOD OF FABRICATING AN ELECTRONIC DEVICE

TECHNICAL FIELD

This invention relates to the technique of bonding a semiconductor chip on a carrier, and in particular to the technique of diffusion soldering.

BACKGROUND

Semiconductor device manufacturers are constantly striving to increase the performance of their products, while decreasing their cost of manufacture. A cost intensive area in the manufacture of semiconductor devices is packaging the semiconductor chips. As those skilled in the art are aware, integrated circuits are fabricated on wafers, which are then singulated to produce semiconductor chips. Subsequently, the semiconductor chips may be mounted on electrically conductive carriers. Mounting of semiconductor chips on electrically conductive carriers is desired to provide for low-stress, mechanically stable and thermally and electrically highly conductive bonds at high yields and low expenses.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

In the figures and the description like reference numerals are generally utilized to refer to like elements throughout. It is to be noted that the various elements and structures shown in the figures are not necessarily drawn to scale. Features and/or elements are illustrated with particular dimensions relative to each other primarily for sake of clarity and ease of understanding; as a consequence, relative dimensions in factual implementations may differ substantially from those illustrated herein.

DETAILED DESCRIPTION OF ILLUSTRATIVE EMBODIMENTS

Figure 1A:
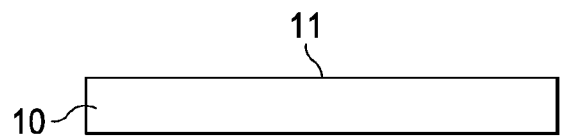
FIGS. 1A-1E schematically illustrate cross-sectional views of one embodiment of a method of bonding a semiconductor chip on an electrically conducting carrier.

The In the following detailed description, reference is made to the accompanying drawings, which form a part thereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

As employed in this specification, the terms "coupled" and/or "electrically coupled" are not meant to mean that the elements must be directly coupled together; intervening elements may be provided between the "coupled" or "electrically coupled" elements.

Devices containing semiconductor chips are described below. In particular, semiconductor chips having a vertical structure may be involved, that is to say that the semiconductor chips may be fabricated in such a way that electric currents can flow in a direction perpendicular to the main surfaces of the semiconductor chips. A semiconductor chip having a vertical structure has electrodes on its two main surfaces, that is to say on its top side and bottom side.

In particular, power semiconductor chips may be involved. Power semiconductor chips may have a vertical structure. The vertical power semiconductor chips may, for example, be configured as power MOSFETs (Metal Oxide Semiconductor Field Effect Transistors), IGBTs (Insulated Gate Bipolar Transistors), JFETs (Junction Gate Field Effect Transistors), power bipolar transistors or power diodes. By way of example, the source electrode and gate electrode of a power MOSFET may be situated on one main surface, while the drain electrode of the power MOSFET is arranged on the other main surface. The semiconductor chips need not be manufactured from specific semiconductor material, for example, Si, SiC, SiGe, GaAs, and, furthermore, may contain inorganic and/or organic materials that are not semiconductors. The semiconductor chips may be of different types and may be manufactured by different technologies.

The semiconductor chips may have contact pads (or electrodes) which allow electrical contact to be made with the integrated circuits included in the semiconductor chips. The contact pads may include one or more metal layers which are applied to the semiconductor material of the semiconductor chips. The metal layers may be manufactured with any desired geometric shape and any desired material composition. The metal layers may, for example, be in the form of a layer covering an area. Any desired metal capable of forming a diffusion solder bond, for example Cu, NiP, NiSn, Au, Ag, Pt, Pd, and an alloy of one or more of these metals may be used as the material. The metal layers need not be homogenous or manufactured from just one material, that is to say various compositions and concentrations of the materials contained in the metal layers are possible.

A porous diffusion solder layer may be used to electrically and mechanically connect the semiconductor chip to a carrier. The electrically conducting porous diffusion solder layer may provide for low-stress, mechanically stable and thermally and electrically highly conductive bonds.

More specifically, the stress σ transmitted through the porous diffusion solder layer is proportional to $\rho^{-2}$, wherein $\rho$ is the pore density in the porous diffusion solder layer. That is, increasing (e.g., doubling) the pore density in the porous diffusion solder layer significantly reduces (e.g., by a factor of $2^2=4$) the stress between the semiconductor chip and the electrically conducting carrier. Reduction of stress is beneficial for increasing production yield and lifetime of the package and for the prevention of failure during operation.

The porous diffusion solder layer may comprise metal particles of a mean diameter in the range between 0.1 and 30 µm, more particularly between 1 and 10 µm. Most or almost each of these particles comprises an intermetallic phase. As there is an intermetallic phase in the particles, the porous solder layer is termed a porous diffusion solder layer.

The intermetallic phase is made of a first metal component, a second metal component and, optionally, a third or additional metal component(s). The first metal component may comprise or be made of at least one or more of Ag, Cu, Au, and In. The second metal component may comprise or be made of at least one or more of Sn and Zn.

The porous diffusion solder layer may comprise a chemical composition in percent by weight of 25% to 50% of the second metal component. In particular, the porous diffusion solder layer may comprise a chemical composition in percent by weight of 50% to 75% of the first metal component, of 25% to 50% of the second metal component and, optionally, one or more residual metal components. This composition is the composition of the intermetallic phase, which is provided in most or almost each of the particles establishing the porous diffusion solder layer.

Most or almost each of the particles establishing the porous diffusion solder layer may be sintered particles. Thus, the porous diffusion solder layer may comprise a sintered or interdiffused structure. The process of particle sintering and the process of forming the intermetallic phase in the particles may be carried out simultaneously by applying heat and pressure to a preliminary layer from which the porous diffusion solder layer is produced. During application of heat and pressure, the particles in the preliminary layer may coalescent, diffusion may occur at the transition regions between adjacent particles and in the particles to exchange and distribute the first and second metal components between and in the particles, and the particles may sinter.

The applied temperature for sintering and intermetallic phase formation may be considerably lower than the melting temperature of the metal of the second component (when provided in macroscopic dimensions). By way of example, temperatures in the range between 100° C. and 200° C. or 100° C. and 180° C. or 100° C. and 150° C. may be applied.

The applied pressure for sintering and intermetallic phase formation may be chosen based on the applied temperature, the desired porosity, the desired electrical conductivity, the layer thickness, the mean particle size, etc. By way of example pressures in the range between 3 to 40 MPa, or 5 to 20 MPa may be applied. By way of example, in some embodiments a pressure of approximately 10 MPa was used.

Characteristic quantities of the porosity of the porous diffusion solder layer such as, e.g., the pore density and/or the mean particle size of the porous diffusion solder layer may be largely controlled by the temperature and pressure applied during the intermetallic phase formation (and, e.g., during sintering). Further, such characteristic properties may be effected by the choice of the particle size of the applied particles before the application of temperature and/or pressure. By way of example, mean particle sizes of the first and second metal components in the range between 0.5 and 30 µm, more particularly between 2 and 10 µm may be used in the preliminary layer.

The porous diffusion solder layer may have a thickness in a range from 1 µm to 50 µm, more particularly 1 µm to 20 µm, and still more particularly 1 µm to 5 µm. The smaller the thickness the better is the electrical and thermal conductivity of the porous diffusion solder layer.

FIGS. 1A-1E schematically illustrate a method of mounting a semiconductor chip on an electrically conducting carrier in accordance with the disclosure. FIG. 1A schematically illustrates an electrically conducting carrier 10. The electrically conducting carrier 10 may, e.g., be a die pad of a leadframe, a PCB (Printed Circuit Board), a DCB (Direct Copper Bond), which is a ceramic substrate with copper layers on its top and bottom surfaces, etc. The electrically conducting carrier 10 may be made of or may have an upper surface 11 made of any desired metal capable of forming a diffusion solder bond, for example Cu, NiP, Sn, Au, Ag, Pd, Pd, etc., or any alloy of one or more of these metals. Further, as will be explained in more detail further below, the upper surface 11 of the electrically conducting carrier 10 may be covered by a coating with low melting point. The coating may e.g., comprise or be made of Sn, Zn or an alloy of one or more of these materials.

Figure 1B:
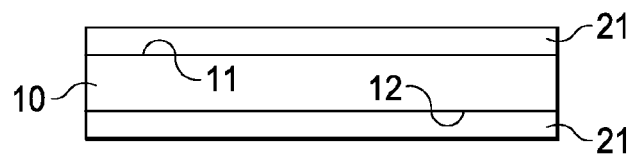

In FIG. 1B a solder paste layer 21 is formed over the upper surface 11 of the carrier 10. The solder paste layer 21 may be formed by applying a paste containing metal particles distributed in a polymer material. The paste may be liquid, viscous or waxy. The paste may comprise metal particles of a first metal component, a second metal component and, optionally, further metal components. The first metal component may comprise of at least one or more of Ag, Cu, Au, and In. The second metal component may comprise at least one or more of Sn and Zn. The polymer material may e.g., a resin such as, e.g., a b-stage resin, α-terpineol etc. The polymer material may be unfilled, i.e., no filler particles may be included within the polymer material.

Pastes containing metal particles can be, for example, purchased from the companies Coocson Electronic, Advanced Nano-Particles (ANP), Harima Chemicals or NBE Technologies. The sizes (average diameters) of the metal particles may be smaller than 30 µm, 10 µm, 5 µm or, in particular, smaller than 1.0 µm or 0.5 µm. The sizes (average diameters) of the metal particles may be larger than 0.1 µm, 0.5 µm, 1.0 µm or, in particular, larger than 2 µm or 5 µm.

By way of example, the paste containing metal particles may be generated by mixing two or more commercially available pastes each containing particles of one or more of the above-mentioned metals. By way of example, if it is intended to produce a porous diffusion solder layer containing metal particles having an $Ag_3Sn$ intermetallic phase, three parts of a first paste containing the metal (Ag) of the first metal component is mixed with one part of the paste containing the metal (Sn) of the second metal component.

The application of the solder paste layer 21 containing the (e.g., different) metal particles dispersed in the liquid, viscous or waxy polymer or combinations thereof may be performed by printing technologies such as e.g., stencil printing, screen printing, ink jet printing, etc. Other techniques for the application of the paste such as e.g., foil stripping techniques or dispensing techniques are also feasible. All these techniques likewise allow for the application of a controllable amount of paste material on the upper surface 11 of the electrically conducting carrier 10.

The thickness of the solder paste layer 21 may be substantially uniform. Otherwise, leveling techniques may be applied in order to provide for a uniform (constant) solder paste layer thickness. In particular, if dispensing techniques are used for the application of the solder paste layer 21, leveling techniques may be suitable.

Optionally, as illustrated in FIG. 1B by way of example, the carrier 10 may have a lower surface 12, which is electrically conducting. A solder paste layer 21 may also be applied to the lower surface 12. Regarding the composition of the solder paste layer 21 and the techniques and methods of application of the solder paste layer 21 on the lower surface 12, reference is made to the description above in order to avoid reiteration.

As mentioned above, the polymer material may e.g., be a b-stage polymer. Herein, b-stage curable polymers are to be understood as polymers which are generally curable in two stages referred to as pre-curing stage and (final) curing stage. Such polymers generally are flowable after deposition onto, for example, a carrier surface (such as, e.g., surface 11 or 12 of carrier 10) and/or are flowable during pre-curing. Pre-curing may transform the b-stage polymer in a solid state and causes the solder paste layer 21 to stick or adhere to the electrically conducting carrier 10. During and after final curing, when cross-linking of the polymer material generally has completed, the material is no longer flowable.

A b-stage curable polymer may comprise one or more of various materials including, for example, α-terpineol-type polymers, cyanacrylates, polyimides, polyimide-polymers, etc. The polymer may comprise an adhesive. For example, the adhesive may comprise an epoxy adhesive in the form of a (b-stage) resin, an acrylic or cyanacrylate adhesive in the form of a (b-stage) resin, a thermosetting polymer including an epoxy resin and a polyamine hardener, etc.

Figure 1C:
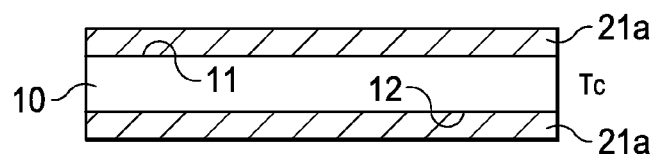

According to FIG. 1C, the b-stage curable polymer in the solder paste layer may be pre-cured by application of, e.g., heat, UV radiation, gamma radiation or other techniques. According to various embodiments, pre-curing may be achieved at a first temperature Tc e.g., by the application of heat. By way of example, Tc may be less than or about 100° C. The polymer material e.g. may also be a solvent or liquid which is vaporizable during pre-curing.

Pre-cured solder paste layers are denoted by reference signs 21a. If no b-stage polymer material is used, the process illustrated with reference to FIG. 1C is omitted and reference sign 21a refers to a solder paste layer which is identical to solder paste layer 21.

Figure 1D:
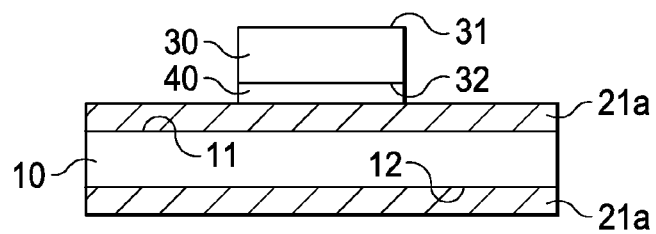

According to FIG. 1D, a semiconductor chip 30 is placed on the pre-cured solder paste layer 21a (or, if not b-stage polymer material is used, on the solder paste layer 21). By way of example, the semiconductor chip 30 may have a chip electrode (not shown) at a lower surface 32 of the semiconductor chip 30. Optionally, the chip electrode at the lower surface 32 of the semiconductor chip 30 may be covered by an intermediate layer 40 made of one or more of the materials of the first metal component (e.g., Ag, Cu, Au, In) and/or of one or more of the materials of the second metal component (e.g., Sn, Zn). By way of example, the intermediate layer 40 may comprise or be made of Ag, or may comprise or be made of Sn coated with Ag, etc. The intermediate layer 40 may be arranged in abutment with the pre-cured solder paste layer 21a (or solder paste layer 21).

The semiconductor chip 30 may further comprise one or more chip electrodes at an upper surface 31 of the semiconductor chip 30. As described above, the semiconductor chip 30 may be a vertical semiconductor device and/or a power device. By way of example, a source electrode and gate electrode of a power MOSFET may be situated on the upper surface 31, while the drain electrode of the power MOSFET may be arranged on lower main surface 32.

Figure 1E:
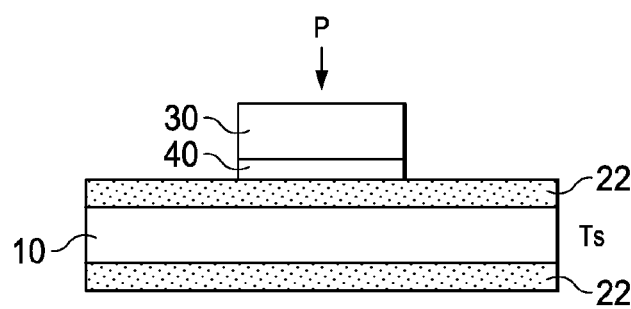

FIG. 1E schematically illustrates that the pre-cured solder paste layer 21a (or, if no pre-curing is performed, the solder paste layer 21) is heated up to a temperature Ts in order to attach the semiconductor chip 30 to the electrically conducting carrier 10 firmly. By way of example, heat may be applied by a hot plate on which the electrically conducting carrier 10 and the semiconductor chip 30 are placed.

In the following, if not stated otherwise, the term solder paste layer 21 both comprises an non-pre-cured solder paste layer 21 and a pre-cured solder paste layer 21a. During application of heat the solder paste layer 21 is subjected to a diffusion soldering process. More specifically, as the temperature Ts is held below the melting point of the second metal component, metal material of the second component does not melt. By way of example, Sn has a melting temperature of 232° C. The solder paste layer 21 is exposed to a maximum temperature Ts which is lower than 232° C. By way of example, the maximum temperature applied to the solder paste layer may be lower than 220° C., 200° C., 180° C., or 150° C.

At the temperature Ts applied, the particles of the first metal component (e.g., Ag, Cu, Au, In) may also not melt. Therefore, during the application of heat in FIG. 1E, the granular particle structure of the solder paste layer 21 is substantially maintained.

External pressure P may be applied during the application of heat. By way of example, external pressure may be in a range from 3 to 40 MPa, more particularly 5 to 20 MPa. Even if external pressure P is applied, the granular, particle-type structure of the solder paste layer 21 is maintained. However, the application of pressure may increase the density or effect the porosity or the internal contact area between particles of the porous diffusion solder layer formed in FIG. 1E.

During application of heat and e.g., pressure, the intermetallic phase is formed. Intermetallic phase formation is promoted or accelerated by increasing the temperature and the applied pressure. The higher the temperature, the higher is the diffusion dynamic in and between adjacent particles. The higher the pressure, the more intense is the contact between adjacent particles, which also promotes the metallic phase formation in particular at the boundaries between adjacent particles (of different metals).

Concurrently with the formation of an intermetallic phase, the solder paste layer 21 is sintered. Sintering may also occur between particles of the same metal. Sintering and intermetallic phase formation both cause the solder paste layer to gain high electrical and thermal conductivity and advanced mechanical properties. In particular, the porous diffusion solder layer provides for a mechanically secure, strong and durable attachment of the semiconductor chip 30 to the electrically conducting carrier 10, whilst allowing for a low-stress bonding between the semiconductor chip 30 and the electrically conducting carrier 10. Thus, low-stress, mechanically stable and thermally and electrically highly conductive bonds may be obtained at high yields and low expenses.

Still referring to FIG. 1E, it is to be noted that the application of heat may also cause the polymer material to evaporate from the porous diffusion solder layer 22. More specifically, depending on the polymer material used (e.g., in case of a b-stage material), the polymer material may be mostly or almost completely be removed from the porous diffusion solder layer 22 during the application of heat. As known in the art of sintering, the polymer material may act as an organic burnout material, which may have an affect on the structure (e.g., porosity, mean pore volume, pore density) of the porous diffusion solder layer 22. The porous diffusion solder layer 22 may thus be composed of sintered particles comprising an intermetallic phase of a first metal component, a second metal component and, optionally, further metal components and of voids formed in the spaces between the sintered metal particles.

FIGS. 2A-2D exemplify stages of a process of mounting a semiconductor chip 30 to an electrically conducting carrier 10. Aspects of the process described in conjunction with FIGS. 2A-2D may be combined with the processes described herein in conjunction with other Figures, and vice versa.

Figure 2A:
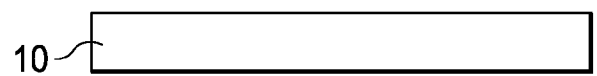
FIGS. 2A-2D schematically illustrate cross-sectional views of one embodiment of a method of bonding a semiconductor chip on an electrically conducting carrier.

In FIG. 2A an electrically conducting carrier 10 is provided. Reference is made to the corresponding description to FIG. 1A.

Figure 2B:
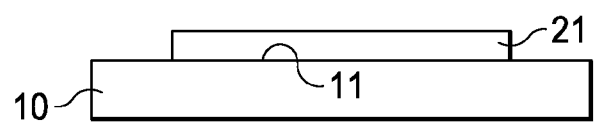

In FIG. 2B a solder paste layer 21 is deposited on an upper surface 11 of the electrically conducting carrier 10. In contrast to the example shown in FIG. 1B, the solder paste layer 21 is structured. That is, either during deposition or by means of subsequent processing such as, e.g., masking, etching etc., the solder paste layer 21 may be designed to have a specific, desired lateral shape and extension. By way of example, the solder paste layer 21 in FIG. 2B may have the form of land, i.e., a flat contact layer, or of an elongated conductor. The solder paste layer 21 may be deposited only on the upper surface 11 of the electrically conducting carrier 10. That is, in contrast to FIG. 1B, the lower surface 12 of the electrically conducting carrier 10 may remain exposed. Without saying, in all embodiments an arbitrary number of surfaces of the electrically conducting carrier 10 may be covered by a solder paste layer 21.

Figure 2C:
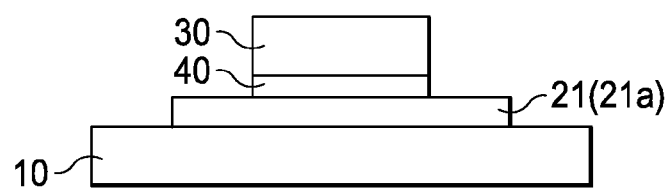

In FIG. 2C the semiconductor chip 30 is placed on the structured solder paste layer 21. As described before, the semiconductor chip 30 may either be equipped with a intermediate layer 40 arranged between the solder paste layer 21 and a bottom electrode (not shown) of the semiconductor chip 30 or not. It may also be possible that the intermediate layer 40 is deposited on the upper surface of the solder paste layer 21, and the semiconductor chip 30 is placed on the previously deposited intermediate layer 40. Further, the intermediate layer 40 may be a sintered layer. As to the materials of which the intermediate layer 40 may be formed, reference is made to the disclosure above.

Further to FIG. 2C, the solder paste layer 21 may be a pre-cured solder paste layer 21a as previously described with reference to FIGS. 1C and 1D.

Figure 2D:
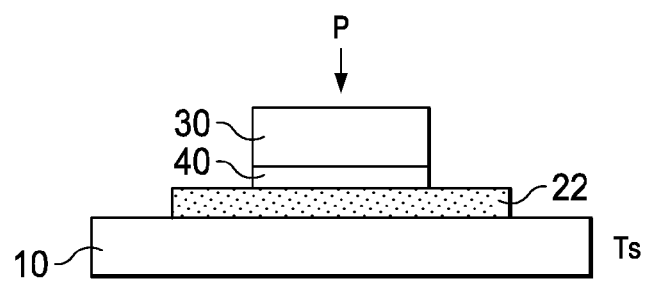

According to FIG. 2D, the semiconductor chip 30 is fixed to the electrically conducting carrier 10 by the application of heat T and, e.g., pressure P. During this process the porous diffusion solder layer 22 is formed. Structure, composition, thickness and all other properties of the porous diffusion solder layer 22 as shown in FIG. 2D may be identical to the corresponding properties set out above.

FIGS. 3A-3D illustrate stages of a process of mounting a semiconductor chip 30 to an electrically conducting carrier 10. Aspects of the processes described in conjunction with FIGS. 1A-1E and 2A-2D may be combined with the processes described in the following, and vice versa.

Figure 3A:
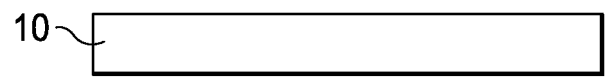
FIGS. 3A-3D schematically illustrate cross-sectional views of one embodiment of a method of bonding a semiconductor chip on an electrically conducting carrier.

In FIG. 3A an electrically conducting carrier 10 is provided. Reference made to the description of FIGS. 1A and 2A.

Figure 3B:
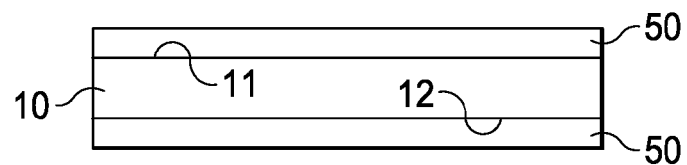

In FIG. 3B an upper surface 11 of the electrically conducting carrier 10 is covered by a coating layer 50. The coating layer 50 may comprise or is made of metals having a low melting point such as, e.g., Sn or Zn. The coating layer 50 may further comprise a thin (e.g., about 10-200 nm, e.g., about 100 nm) anti-tarnish protection layer comprising or made of a noble metal such as, e.g., Ag, Au, Pd, etc. The anti-tarnish protection layer prevents oxidation of the underlying low melting point metal of the coating layer 50.

By way of example, as depicted in FIG. 3B, also the lower surface 12 of the electrically conducting carrier 10 may be covered by a coating layer 50.

Figure 3C:
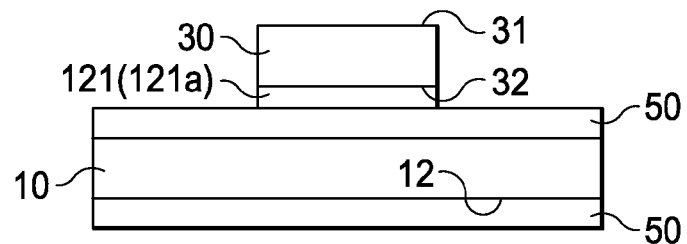

In FIG. 3C the semiconductor chip 30 is placed on the electrically conducting carrier 10. As described before, the semiconductor chip 30 may have an upper surface 31 and a lower surface 32. Each of these surfaces 31, 32 may contain one or more chip electrodes (not shown). In FIG. 3C a solder paste layer 121 covers an electrode at the lower surface 32 of the semiconductor chip 30. The solder paste layer 121 may be identical in all properties to the solder paste layer 21 or pre-cured solder paste layers 21a. In the latter case a pre-curing temperature process as described in conjunction with FIG. 1C has been performed earlier. An example of fabricating the semiconductor chip 30 with solder paste layer 121 will be described further below in conjunction with FIG. 4C.

Figure 3D:
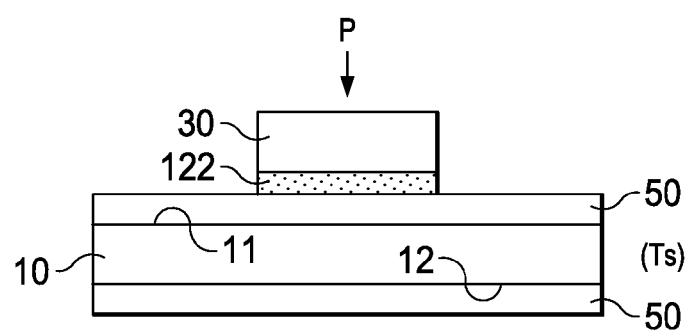

In FIG. 3D the semiconductor chip 30 is affixed to the electrically conducting carrier 10 by the application of heat (temperature Ts at the solder paste layer 121) and pressure P. That way, as explained above, the solder paste layer 121 (or pre-cured solder paste layer 121a) transforms into the porous diffusion solder layer 122. The porous diffusion solder layer 122 may be identical in all properties to the porous diffusion solder layer 22, and therefore, reference is made to the corresponding disclosure herein in order to avoid reiteration.

As illustrated by way of example in FIGS. 3B-3D, also the lower surface 12 of the carrier 10 may optionally be covered by a coating layer 50. In this case, similar to the exemplary process described in conjunction with FIGS. 1A-1E, a semiconductor chip 30 may also be fixed (e.g., concurrently) to the lower surface 12 of the electrically conducting carrier 10.

FIGS. 4A-4D exemplify stages of a process of providing a semiconductor chip 30 equipped with a solder paste layer 121 (including a pre-cured solder paste layer 121a) as used in FIG. 3C of the process described above.

Figure 4A:
FIGS. 4A-4D schematically illustrate cross-sectional views of one embodiment of a method of providing a semiconductor chip with a porous diffusion solder bond layer.

In FIG. 4A a semiconductor wafer 200 is provided. The semiconductor wafer 200 may include integrated circuits formed in previous semiconductor wafer processing steps. Further, by way of example, chip electrodes associated with the respective integrated circuits have also been generated in previous wafer processing steps and may be situated on the lower main surface and, optionally, also on the upper main surface of the semiconductor wafer 200.

Figure 4B:
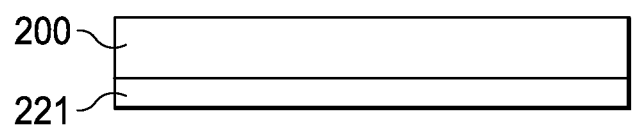

In FIG. 4B a solder paste layer 221 is deposited on the lower main surface of the semiconductor wafer 200. The solder paste layer 221 as well as the techniques to apply the solder paste layer 221 to the wafer 200 may be identical to the disclosure to solder paste layer 21 as described before. Other layer formation and processing techniques known in wafer technology, such as e.g., spin coating, sputtering, chemical and/or mechanical polishing (CMP) may also be used. In particular, the solder paste layer 221 may have the same composition, the same thickness and may optionally be structured (not shown) the same way as explained herein before with reference to FIGS. 1A-1E and 2A-2D.

Figure 4C:
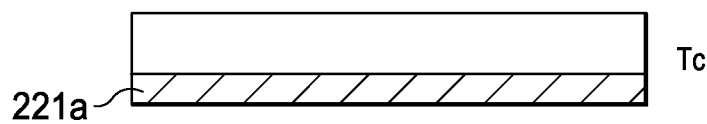

In FIG. 4C, similar to FIG. 1C, the solder paste layer 221 may be pre-cured in order to generate a pre-cured solder paste layer 221a. Pre-curing may e.g., be used if the solder paste layer 221 contains a b-stage polymer material. Pre-curing is done at a temperature Tc. By way of example, Tc is smaller than or about 100° C. All process steps described in conjunction with FIGS. 4A-4C may be carried out on wafer level.

Figure 4D:
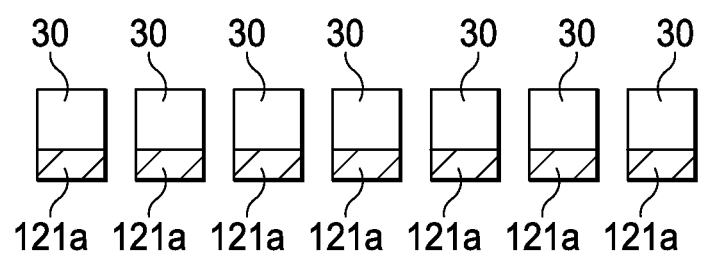

As illustrated in FIG. 4D, semiconductor chips 30 are then separated from one another by separating the semiconductor wafer 200 and possibly the solder paste layer 221 (or pre-cured solder paste layer 221a). By way of example, sawing, cutting, etching or laser beams dicing may be used for the separation step. Without saying, if the solder paste layer 221 has been structured before, separation of the solder paste layer 221 (or pre-cured solder paste layer 221a) may not be necessary. FIG. 4D illustrates a number of individualized semiconductor chips 30 equipped with a pre-cured solder paste layer 121a as may be used in the process of FIG. 3C.

Without saying, pre-curing of the solder paste layer 221, as shown in FIG. 4C, may be omitted or may be performed after the separation of the semiconductor wafer 200 in individual semiconductor chips 30. More specifically, the processes illustrated in FIGS. 4B-4C could also be performed after the separation step. The process illustrated in FIGS. 4A-4D may also provide for semiconductor chips 30 coated by a non-cured solder paste layer 121.

Figure 5A:
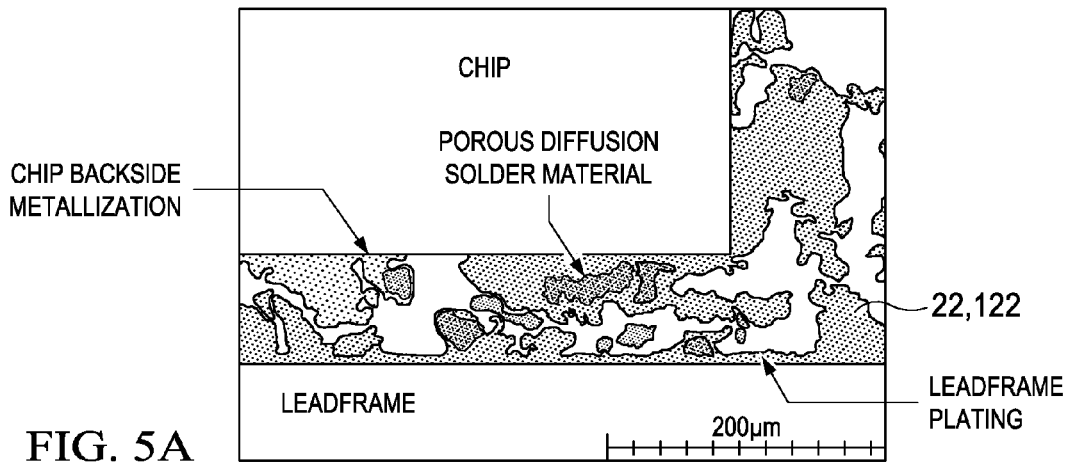
FIGS. 5A-5C are a cross-sectional electron microscope images of a porous diffusion solder layer with increasing magnification.
Figure 5B:
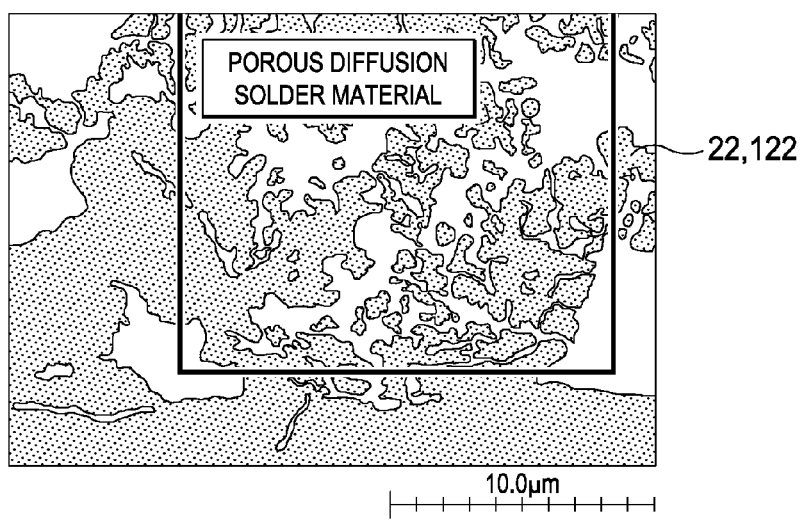
Figure 5C:
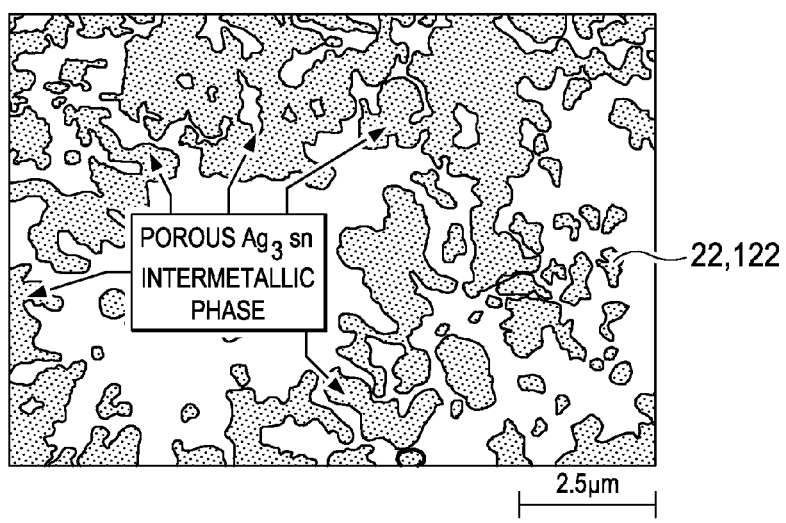

FIGS. 5A-5C illustrate images of a scanning electron microscope (SEM) showing the structure of the porous diffusion solder layer 22, 122 in different magnifications.

FIG. 5A illustrates a SEM image showing a porous diffusion solder layer 22, 122 provided between a leadframe 10 and a semiconductor chip 30. Further, a leadframe plating, corresponding to coating layer 50, and a chip backside metallization 70, corresponding to a chip electrode, are visible. In this example, the porous diffusion solder layer 22, 122 has a composition of 50% by weight of Ag and 50% by weight of Sn. Further, process parameters of Ts=150° C. and P=10 MPa were used.

As may be seen from FIG. 5A, on a macroscopic scale the porous diffusion solder layer 22, 122 may be rather inhomogeneous. In particular, large voids in the order of magnitude of tens of microns (i.e., in the order of the layer thickness) are visible.

FIG. 5B is a SEM image showing a partial view of FIG. 5A in greater magnification. As apparent, the porous diffusion solder layer 22, 122 exhibits a microscopic porosity across at least a significant portion of the diffusion solder layer 22, 122.

FIG. 5C is a magnification of a portion of FIG. 5B. As may be seen in FIG. 5C, a microscopic porous structure formed by sintered particles is provided in the porous diffusion solder layer 22, 122. As it is apparent from the image, the porous constitution is formed by sintered particles and voids. The particles are at least partly in contact to each other. It has been verified by investigations that in the particles an intermetallic phase formation has occurred. Here, by way of example, the SEM image illustrates the porous structure comprises e.g., some particles of an $Ag_3Sn$ intermetallic phase. Of course, the structure and composition of the porous diffusion solder layer may not be completely homogeneous across the entire layer thickness. Regions of the porous diffusion solder layer may be more dense/less porous than other regions and there may also be highly compressed regions with virtually no or very little porosity. However, even in case of a somewhat inhomogeneous distribution of porosity in the layer, the overall mechanical properties of the layer are significantly changed by the porous structure.

Figure 6A:
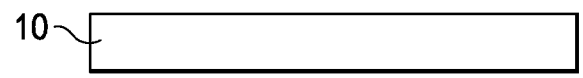
FIGS. 6A-6D schematically illustrate cross-sectional views of one embodiment of a method of providing a semiconductor chip with a porous bond layer.

FIGS. 6A-6D exemplify stages of a process of mounting a semiconductor chip 30 on an electrically conducting carrier 10. As shown in FIG. 6A, an electrically conducting carrier 10 is provided.

Figure 6B:
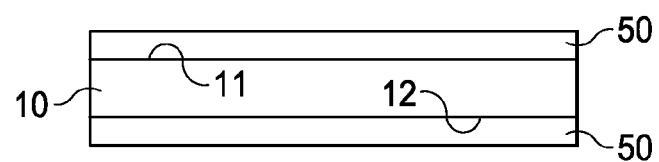

According to FIG. 6B, the electrically conducting carrier 10 may be provided with one or two coating layers 50 as e.g., described previously with reference to FIG. 3B.

Figure 6C:
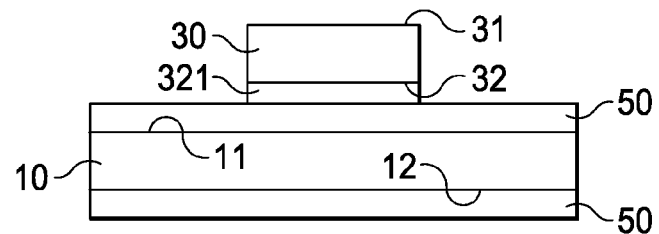
Figure 6D:
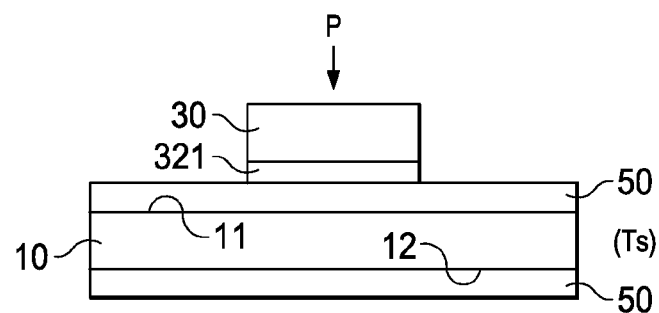

In FIG. 6C a semiconductor chip 30 is placed on the electrically conducting carrier 10. The semiconductor chip 30 is equipped with a porous layer 321. The porous layer 321 may e.g., be made of a porous ceramics material or porous silicon. Porous silicon may be obtained by etching the corresponding surface (e.g., lower surface 32) of the semiconductor wafer 200 or semiconductor chip 30.

More specifically, the semiconductor chip 30 with porous layer 321 may be produced similar to the process illustrated in FIGS. 4A-4D. If the porous layer 321 is a porous silicon layer, the process shown in FIG. 4B translates into the generation of this porous silicon layer 321 by, e.g., silicon etching (instead of applying the solder paste layer 221), and the process shown in FIG. 4D translates into the individualization or separation of the corresponding semiconductor chips 30 with corresponding sections of the porous silicon layer 321. If the porous layer 321 is a porous ceramics layer, the process shown in FIG. 4B translates into the application of a porous ceramics layer 321 (instead of the solder paste layer 221) on the lower surface of the semiconductor wafer 200, and the process shown in FIG. 4D translates into the separation of the individual semiconductor chips 30 equipped with corresponding sections of the porous ceramics layer 321.

Returning to the process illustrated in FIGS. 6A-6D, the semiconductor chip 30 may be attached to the electrically conducting carrier 10 by the application of heat (temperature Ts) and pressure P. Here, the low melting point material (i.e., solder material) of the coating layer 50 connects to a chip electrode (not shown) at the bottom of the porous layer 321 and thereby fixes the semiconductor chip 30 to the electrically conducting carrier 10. The porous layer 321 is situated between the chip electrode (not shown) and the bulk material of the semiconductor chip 30 and provides for a low-stress and mechanically stable bond between the semiconductor chip 30 and the electrically conducting carrier 10.

While a particular feature or aspect of an embodiment of the invention may have been disclosed with respect to only one of several implementations, such feature or aspect may be combined with one or more other features or aspects of the other implementations as may be desired and advantageous for any given or particular application.

While specific embodiments have been illustrated and described herein, it will be appreciated by those of normal skill in the art that many modifications may be made, adaptations be performed and variants be implemented in view of the specific embodiments shown and described without departing from the scope of the present invention. Accordingly, it is intended that any such modifications, adaptations and variations of the specific embodiments discussed herein are covered and the invention be limited only by the scope of the claims.

What is claimed is:

1. A semiconductor device, comprising:
an electrically conducting carrier;
a semiconductor chip disposed over the carrier; and
a porous diffusion solder layer disposed between the carrier and the semiconductor chip, wherein the porous diffusion solder layer comprises sintered particles having an intermetallic phase.

2. The semiconductor device of claim 1, wherein the sintered particles comprise a first metal component selected from the group consisting of Ag, Cu, Au, and In, and a second metal component selected from the group consisting of Sn and Zn.

3. The semiconductor device of claim 2, wherein the porous diffusion solder layer comprises a chemical composition in percent by weight of 50% to 75% of the first metal component and of 25% to 50% of the second metal component.

4. The semiconductor device of claim 1, further comprising a first intermediate layer disposed between the carrier and the porous diffusion solder layer, wherein the first intermediate layer comprises Sn or Zn.

5. The semiconductor device of claim 4, wherein the first intermediate layer comprises a surface formed by an anti-tarnish layer.

6. The semiconductor device of claim 1, wherein the porous diffusion solder layer comprises a thickness in a range from 1 µm to 50 µm.

7. The semiconductor device of claim 1, wherein the carrier is a leadframe.

8. The semiconductor device of claim 1, further comprising a second intermediate layer disposed between the porous diffusion solder layer and the semiconductor chip, wherein the second intermediate layer comprises a sintered or inter-diffused metal layer.

9. A semiconductor arrangement, comprising:
a semiconductor body; and
a solder paste layer disposed over at least one main surface of the semiconductor body, the solder paste layer comprising first particles of a first metal component selected from the group consisting of Ag, Cu, Au, and In, second particles of a second metal component selected from the group consisting of Sn and Zn and a polymer material embedding the first particles and the second particles.

10. The semiconductor arrangement of claim 9, wherein the polymer material comprises a B-stage polymer material.

11. The semiconductor arrangement of claim 10, wherein the B-stage polymer material is pre-cured.

12. The semiconductor arrangement of claim 9, wherein the polymer material comprises a solvent or liquid.

13. The semiconductor arrangement of claim 12, wherein the solvent or liquid is vaporizable during pre-curing.

14. The semiconductor arrangement of claim 9, wherein a total metal contribution of the solder paste layer comprises a chemical composition in percent by weight of 50% to 75% of the first metal component and of 25% to 50% of the second metal component.

15. The semiconductor arrangement of claim 9, wherein the first particles or second particles are sintered or interdiffused.

* * * * *